(12) United States Patent
Kim et al.

(10) Patent No.: US 9,071,230 B2
(45) Date of Patent: Jun. 30, 2015

(54) GATE DRIVING CIRCUIT AND DISPLAY APPARATUS HAVING THE SAME

(71) Applicant: Samsung Display Co., Ltd., Yongin (KR)

(72) Inventors: Jong-Hee Kim, Hwaseong-si (KR); Yeong-Keun Kwon, Yongin-si (KR); Ji-Sun Kim, Seoul (KR); Jae-Keun Lim, Suwon-si (KR); ChongChel Chai, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/242,431

(22) Filed: Apr. 1, 2014

(65) Prior Publication Data
US 2015/0042689 A1 Feb. 12, 2015

(30) Foreign Application Priority Data
Aug. 12, 2013 (KR) .......................... 10-2013-0095506

(51) Int. Cl.
*G09G 3/36* (2006.01)
*H03K 3/012* (2006.01)
*G11C 19/28* (2006.01)

(52) U.S. Cl.
CPC .............. *H03K 3/012* (2013.01); *G09G 3/3674* (2013.01); *G11C 19/28* (2013.01); *G09G 2310/0267* (2013.01); *G09G 2310/0286* (2013.01); *G09G 2320/043* (2013.01)

(58) Field of Classification Search
CPC . G09G 3/3688; G09G 3/3648; G09G 3/3614; G09G 2310/027; G09G 2330/021
See application file for complete search history.

(56) References Cited

U.S. PATENT DOCUMENTS

| 2008/0309597 | A1* | 12/2008 | Nam et al. ...................... 345/87 |
| 2010/0302217 | A1 | 12/2010 | Ochiai |
| 2011/0298761 | A1 | 12/2011 | Seo |
| 2012/0287099 | A1 | 11/2012 | Toyotaka |
| 2013/0181747 | A1* | 7/2013 | Yoon et al. .................... 327/108 |

FOREIGN PATENT DOCUMENTS

| JP | 2011-085664 | 4/2011 |
| KR | 10-0608885 | 8/2006 |
| KR | 10-1020627 | 3/2011 |
| KR | 10-2013-0028274 | 3/2013 |
| KR | 10-1243806 | 3/2013 |

* cited by examiner

Primary Examiner — Kevin Nguyen
(74) Attorney, Agent, or Firm — H.C. Park & Associates, PLC (57) ABSTRACT

A gate driving circuit and a display apparatus having the gate driving circuit, in which the gate driving circuit includes a voltage adjusting part using a low clock signal to increase the reliability of the gate driving circuit, thereby extending the lifetime of the gate driving circuit.

20 Claims, 7 Drawing Sheets

GATE DRIVING CIRCUIT AND DISPLAY APPARATUS HAVING THE SAME

CROSS-REFERENCE TO RELATED APPLICATION

This application claims priority from and the benefit of Korean Patent Application No. 10-2013-0095506, filed on Aug. 12, 2013, which is hereby incorporated by reference for all purposes as if fully set forth herein.

BACKGROUND

1. Field

Exemplary embodiments of the present invention relate to a gate driving circuit and a display apparatus having the gate driving circuit. More particularly, exemplary embodiments of the present invention relate to a gate driving circuit having improved reliability, and a display apparatus including the gate driving circuit.

2. Discussion of the Background

Generally, a liquid crystal display ("LCD") apparatus includes a first substrate including a pixel electrode, a second substrate including a common electrode, and a liquid crystal layer disposed between the first and second substrate. An electric field is generated by voltages applied to the pixel electrode and the common electrode. By adjusting an intensity of the electric field, the transmission of light passing through the liquid crystal layer may be adjusted so that a desired image may be displayed.

Generally, a display apparatus includes a display panel and a panel driver. The display panel includes gate lines and data lines. The panel driver includes a gate driver providing gate signals to the gate lines and a data driver providing data voltages to the data lines.

The gate driver includes a gate driving circuit including switching elements. The switching element may be a thin film transistors ("TFT"). When a relatively high voltage is applied between a drain electrode and a source electrode of a switching element in the gate driving circuit, a characteristic of the switching element is changed such that the reliability of the gate driving circuit is reduced, resulting in a shortened lifetime of the gate driving circuit.

In addition, when a positive voltage is continuously applied to a gate electrode and a source electrode of the switching element, a threshold voltage of the switching element may increase so that a positive shift of the threshold voltage may occur. When a negative voltage is continuously applied to the gate electrode and the source electrode of the switching element, a threshold voltage of the switching element may decreases so that a negative shift of the threshold voltage may occur.

The above information disclosed in this Background section is only for enhancement of understanding of the background of the invention and, therefore, it may contain information that does not form the prior art that is already known in this country to a person of ordinary skill in the art.

SUMMARY

Exemplary embodiments of the present invention provide a gate driving circuit having increased reliability and a longer lifetime.

Exemplary embodiments of the present invention also provide a display apparatus having the gate driving circuit.

Additional features will be set forth in the description which follows and, in part, will be apparent from the description, or may be learned by practice of the invention.

An exemplary embodiment of the present invention discloses a gate driving circuit including a pull-up control part, a pull-up part, a carry part, a first voltage adjusting part, a first pull-down part and a second pull-down part. The pull-up control part is configured to apply a carry signal of one of previous stages to a first node in response to the carry signal of one of the previous stages. The pull-up part is configured to output a clock signal as an N-th gate output signal in response to a signal applied to the first node, where N is a positive integer. The carry part is configured to output the clock signal as an N-th carry signal in response to the signal applied to the first node. The first voltage adjusting part is configured to output a low clock signal to a second node in response to the signal applied to the first node. The first pull-down part is configured to pull down the signal at the first node to a second "off" voltage in response to a carry signal of one of next stages. The second pull-down part is configured to pull down the N-th gate output signal to a first "off" voltage in response to the carry signal of one of the next stages.

An exemplary embodiment of the present invention also discloses a display apparatus including a display panel, a data driving circuit, and a gate driving circuit. The display panel includes a display region on which an image is displayed, and a peripheral region adjacent to the display region. The data driving circuit is configured to apply a data voltage to the display panel. The gate driving circuit is configured to apply a gate output signal to the display panel. The gate driving circuit includes a pull-up control part, a pull-up part, a carry part, a first voltage adjusting part, a first pull-down part and a second pull-down part. The pull-up control part is configured to apply a carry signal of one of previous stages to a first node in response to the carry signal of one of the previous stages. The pull-up part is configured to output a clock signal as an N-th gate output signal in response to a signal applied to the first node, where N is a positive integer. The carry part is configured to output the clock signal as an N-th carry signal in response to the signal applied to the first node. The first voltage adjusting part is configured to output a low clock signal to a second node in response to the signal applied to the first node. The first pull-down part is configured to pull down the signal at the first node to a second "off" voltage in response to a carry signal of one of next stages. The second pull-down part is configured to pull down the N-th gate output signal to a first "off" voltage in response to the carry signal of one of the next stages.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

It will be understood that when an element or layer is referred to as being "on", "connected to", or "coupled to" another element or layer, it can be directly on, connected to, or coupled to the other element or layer, or intervening elements or layers may be present. In contrast, when an element is referred to as being "directly on," "directly connected to", or "directly coupled to" another element or layer, there are no intervening elements or layers present. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers, and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
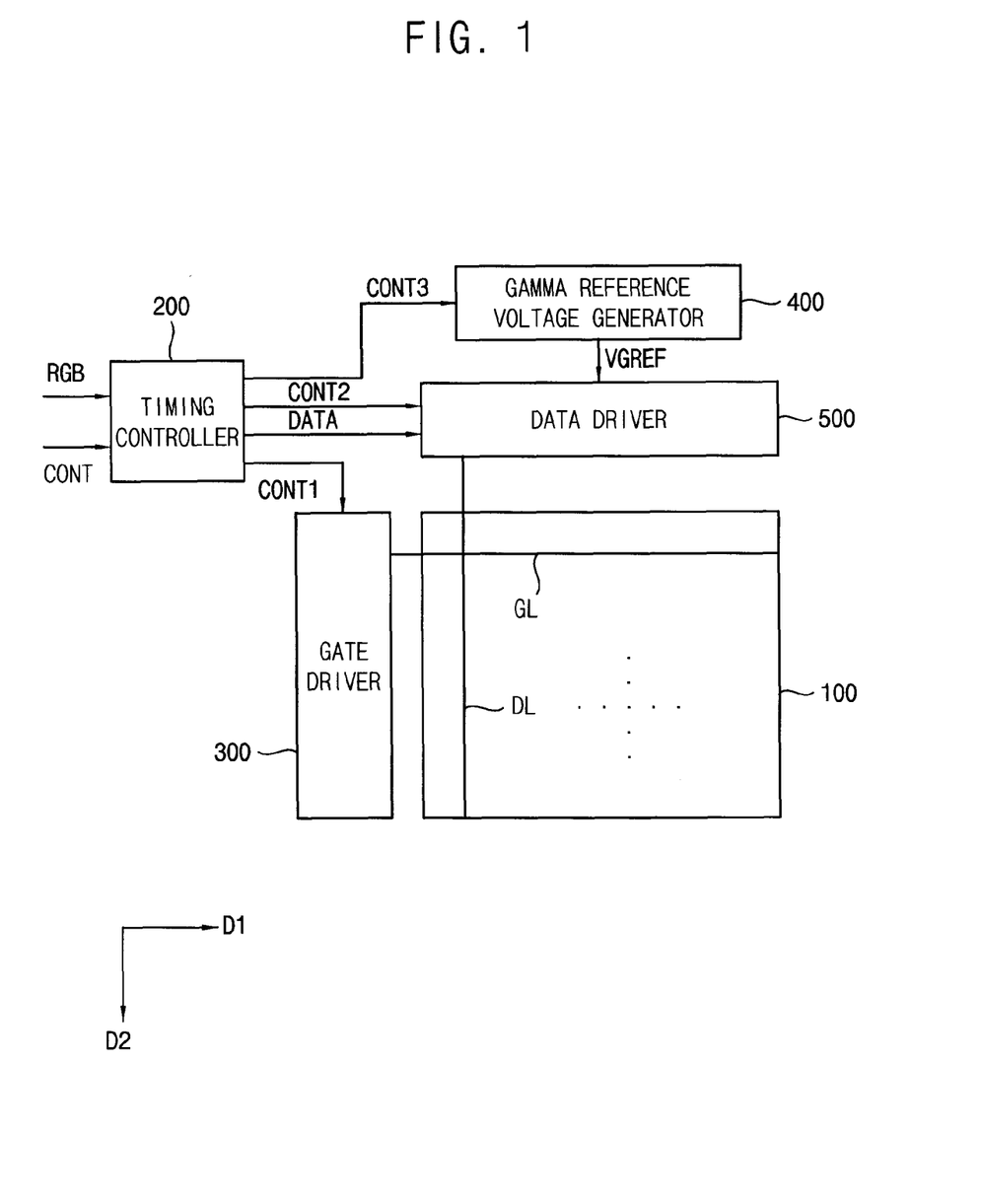
FIG. 1 is a block diagram illustrating a display apparatus according to an exemplary embodiment of the present invention.

FIG. 1 is a block diagram illustrating a display apparatus according to an exemplary embodiment of the present invention.

Referring to FIG. 1, the display apparatus includes a display panel 100 and a panel driver. The panel driver includes a timing controller 200, a gate driver 300, a gamma reference voltage generator 400, and a data driver 500.

The display panel 100 has a display region on which an image is displayed, and a peripheral region adjacent to the display region. The display panel 100 includes gate lines GL, data lines DL, and unit pixels connected to the gate lines GL and the data lines DL. The gate lines GL extend in a first direction D1, and the data lines DL extend in a second direction D2 crossing the first direction D1.

Each unit pixel includes a switching element (not shown), a liquid crystal capacitor (not shown), and a storage capacitor (not shown). The liquid crystal capacitor and the storage capacitor are electrically connected to the switching element. The unit pixels may be disposed in a matrix.

The timing controller 200 receives input image data RGB and an input control signal CONT from an external apparatus (not shown). The input image data may include red image data R, green image data G, and blue image data B. The input control signal CONT may include a master clock signal and a data enable signal. The input control signal CONT may include a vertical synchronizing signal and a horizontal synchronizing signal.

The timing controller 200 generates a first control signal CONT1, a second control signal CONT2, a third control signal CONT3, and a data signal DATA based on the input image data RGB and the input control signal CONT.

The timing controller 200 generates the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The timing controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The timing controller 200 generates the data signal DATA based on the input image data RGB. The timing controller 200 outputs the data signal DATA to the data driver 500.

The timing controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the timing controller 200. The gate driver 300 sequentially outputs the gate signals to the gate lines GL.

The gate driver 300 may be directly mounted on the display panel 100, or may be connected to the display panel 100 via a tape carrier package (TCP). Alternatively, the gate driver 300 may be integrated on the display panel 100.

The gamma reference voltage generator 400 generates a gamma reference voltage VGREF in response to the third control signal CONT3 received from the timing controller 200. The gamma reference voltage generator 400 provides the gamma reference voltage VGREF to the data driver 500. The gamma reference voltage VGREF has a value corresponding to a level of the data signal DATA.

In an exemplary embodiment, the gamma reference voltage generator 400 may be disposed either in the timing controller 200 or in the data driver 500.

The data driver 500 receives the second control signal CONT2 and the data signal DATA from the timing controller 200, and receives the gamma reference voltages VGREF from the gamma reference voltage generator 400. The data driver 500 converts the data signal DATA into analog data voltages using the gamma reference voltages VGREF. The data driver 500 sequentially outputs the data voltages to the data lines DL.

The data driver 500 may include a shift register (not shown), a latch (not shown), a signal processing part (not shown) and a buffer part (not shown). The shift register outputs a latch pulse to the latch. The latch temporally stores the data signal DATA. The latch outputs the data signal DATA to the signal processing part. The signal processing part generates an analog data voltage based on the digital data signal and the gamma reference voltage VGREF. The signal processing part outputs the data voltage to the buffer part. The buffer part compensates the data voltage to have a uniform level. The buffer part outputs the compensated data voltage to the data line DL.

The data driver 500 may be directly mounted on the display panel 100, or be connected to the display panel 100 via a TCP. Alternatively, the data driver 500 may be integrated on the display panel 100.

Figure 2:
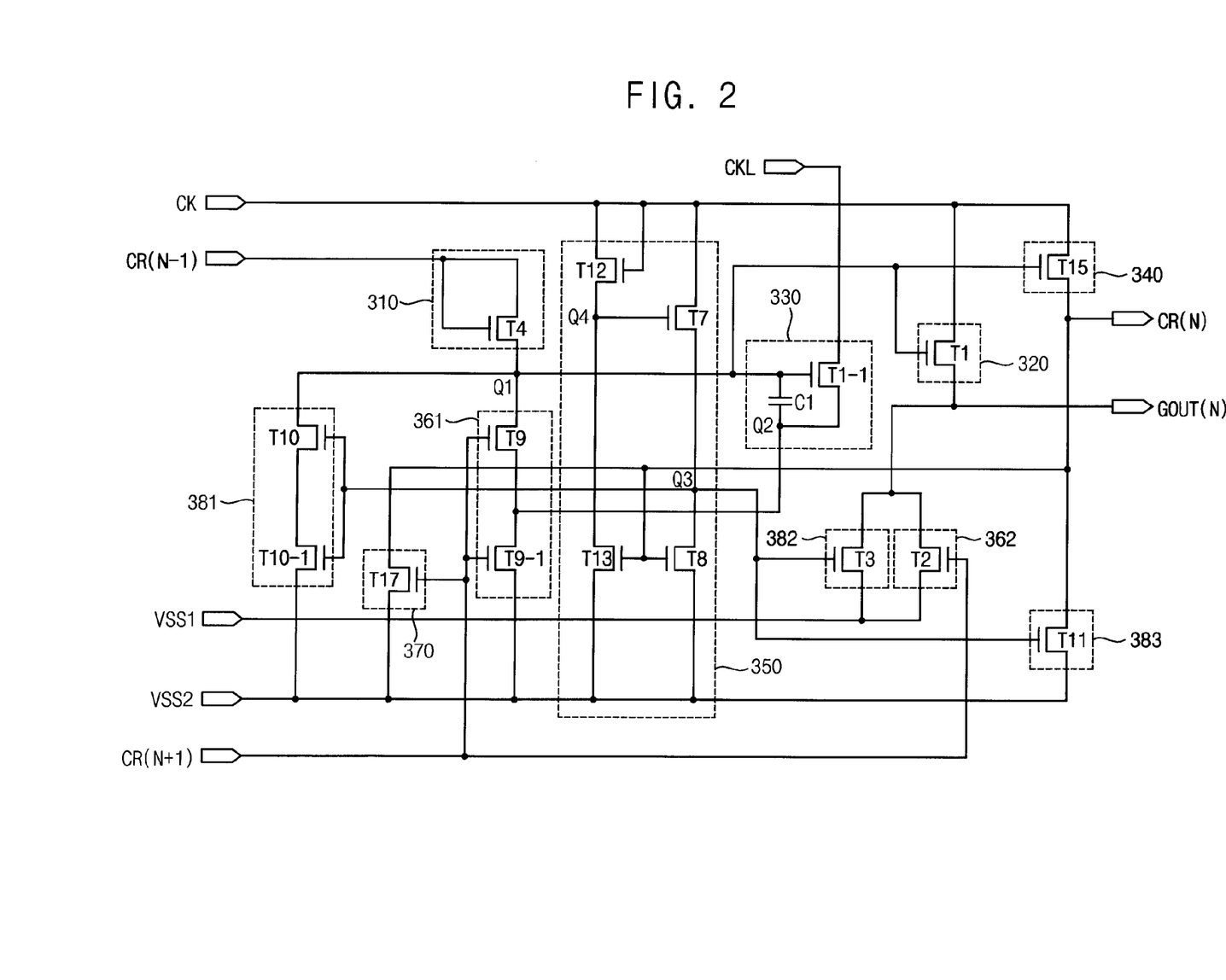
FIG. 2 is an equivalent circuit diagram illustrating an N-th stage of the gate driver of FIG. 1.
Figure 3:
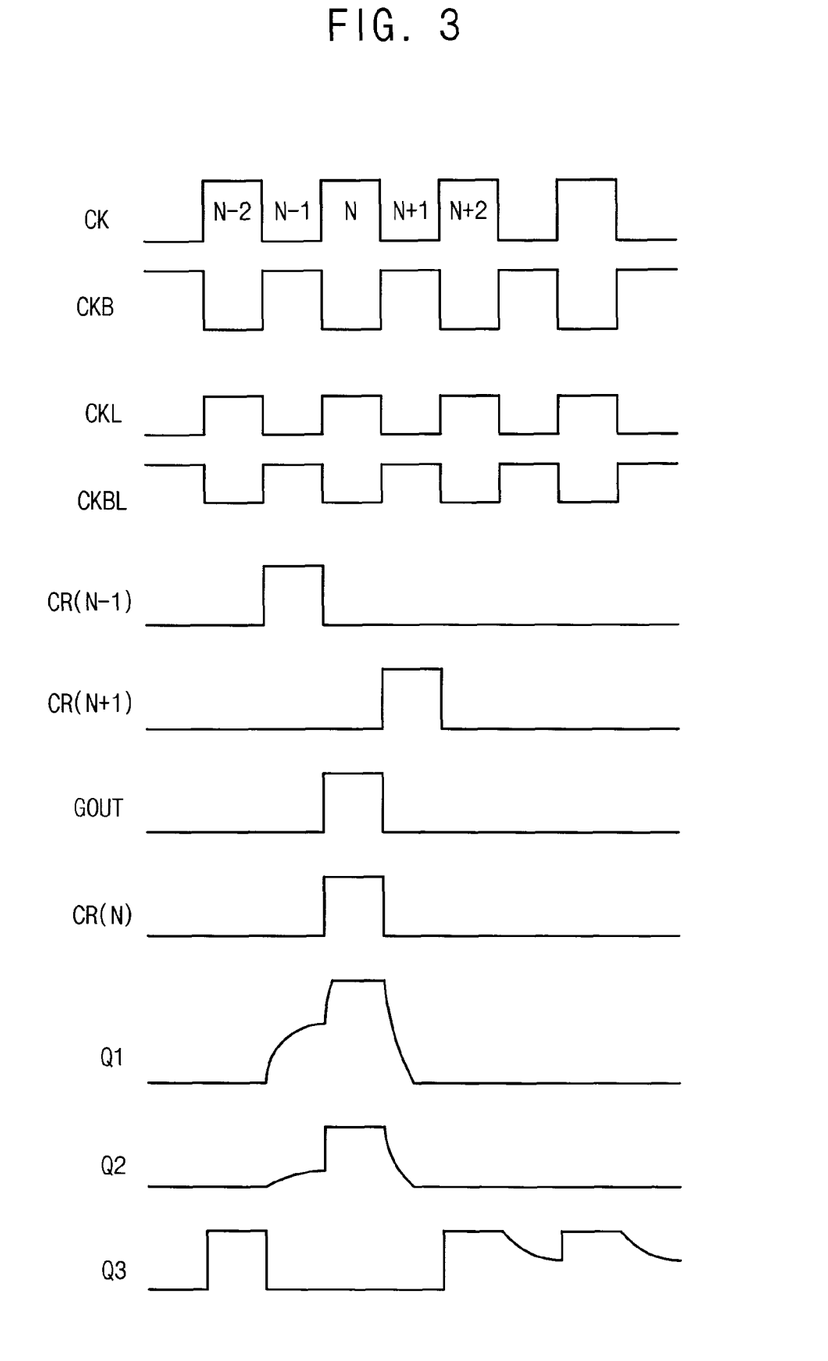
FIG. 3 is a waveform diagram illustrating input signals, node signals, and output signals of the N-th stage of the gate driver of FIG. 2.

FIG. 2 is an equivalent circuit diagram illustrating an N-th stage of the gate driver 300 of FIG. 1. FIG. 3 is a waveform diagram illustrating input signals, node signals and output signals of the N-th stage of the gate driver 300 of FIG. 2.

Referring to FIGS. 1 to 3, the gate driver 300 receives a first clock signal CK, a second clock signal CKB, a first low clock signal CKL, a second low clock signal CKBL, a first "off" voltage VSS1 and a second "off" voltage VSS2. The gate driver 300 outputs a gate output signal GOUT.

The first clock signal CK is applied to a clock terminal. The first low clock signal CKL is applied to a low clock terminal. The first "off" voltage VSS1 is applied to a first "off" terminal. The second "off" voltage VSS2 is applied to a second "off" terminal. The gate output signal GOUT is outputted from a gate output terminal.

The first clock signal CK is a square wave having a high level and a low level which alternate with each other. The high level of the first clock signal CK may correspond to a first "on" voltage. The low level of the first clock signal CK may correspond to the second "off" voltage VSS2. A duty ratio of the first clock signal CK may be about 50%. Alternatively, the duty ratio of the first clock signal CK may be less than 50%. The first clock signal CK may be applied to odd-numbered stages of the gate driver 300 or to even-numbered stages of the gate driver 300. For example, the first "on" voltage may be between about 15V and about 20V.

The first low clock signal CKL is a square wave having a high level and a low level which alternate with each other. An amplitude of the first low clock signal CKL may be less than an amplitude of the first clock signal CK. A phase of the first low clock signal CKL may be same as a phase of the first clock signal CK.

The high level of the first low clock signal CKL may correspond to a second "on" voltage which is less than the first "on" voltage. The low level of the first low clock signal CKL may correspond to the second "off" voltage VSS2. A duty ratio of the first low clock signal CKL may be about 50%. Alternatively, the duty ratio of the first low clock signal CKL may be less than 50%. The first low clock signal CKL may be applied to the odd-numbered stages of the gate driver 300 or the even-numbered stages of the gate driver 300. The first low clock signal CKL may be applied to the stages to which the first clock signal CK is applied. For example, the second "on" voltage may be between about 5V and about 10V.

The second clock signal CKB is a square wave having a high level and a low level which alternate with each other. The high level of the second clock signal CKB may correspond to the first "on" voltage. The low level of the second clock signal CKB may correspond to the second gate "off" voltage VSS2. A duty ratio of the second clock signal CKB may be 50%. Alternatively, the duty ratio of the second clock signal CKB may be less than 50%. The second clock signal CKB may be applied to odd-numbered stages of the gate driver 300 or to even-numbered stages of the gate driver 300. For example, when the first clock signal CK is applied to the odd-numbered stages of the gate driver 300, the second clock signal CKB is applied to the even-numbered stages of the gate driver 300. For example, when the first clock signal CK is applied to the even-numbered stages of the gate driver 300, the second clock signal CKB is applied to the odd-numbered stages of the gate driver 300. For example, the second clock signal CKB may be an inverting signal of the first clock signal CK.

The second low clock signal CKBL is a square wave having a high level and a low level which alternate with each other. An amplitude of the second low clock signal CKBL may be less than an amplitude of the second clock signal CKB. A phase of the second low clock signal CKBL may be same as a phase of the second clock signal CKB.

The high level of the second low clock signal CKBL may correspond to the second "on" voltage, which is less than the first "on" voltage. The low level of the second low clock signal CKBL may correspond to the second "off" voltage VSS2. A duty ratio of the second low clock signal CKBL may be about 50%. Alternatively, the duty ratio of the second low clock signal CKBL may be less than 50%. The second low clock signal CKBL may be applied to the odd-numbered stages of the gate driver 300 or the even-numbered stages of the gate driver 300. The second low clock signal CKBL may be applied to the stages to which the second clock signal CKB is applied. For example, the second low clock signal CKBL may be an inverting signal of the first low clock signal CKL.

The first "off" voltage VSS1 may be a direct-current ("DC") signal. The second "off" voltage may be a DC signal. The second "off" voltage may be less than the first "off"

voltage VSS1. For example, the first "off" voltage VSS1 may be about −5V. For example, the second "off" voltage VSS2 may be about −10V.

The N-th stage outputs an N-th gate output signal GOUT(N) and an N-th carry signal CR(N) in response to an (N−1)-th carry signal CR(N−1) of an (N−1)-th stage, which is a previous stage of the N-th stage. The N-th stage pulls down the N-th gate output signal GOUT(N) to the first "off" voltage VSS1 in response to an (N+1)-th carry signal CR(N+1) of an (N+1)-th stage, which is a next stage of the N-th stage. Herein, N is a natural number.

In a similar manner, the first to last stages sequentially output gate output signals GOUT.

The (N−1)-th carry signal CR(N−1) is applied to an (N−1)-th carry terminal. The (N+1)-th carry signal CR(N+1) is applied to an (N+1)-th carry terminal. The N-th carry signal CR(N) is outputted from an N-th carry terminal.

The n-th stage includes a pull-up control part 310, a pull-up part 320, a first voltage adjusting part 330, a carry part 340, an inverting part 350, a first pull-down part 361, a second pull-down part 362, a carry stabilizing part 370, a first holding part 381, a second holding part 382, and a third holding part 383. The pull-up control part 310 applies the (N−1)-th carry signal CR(N−1) to a first node Q1 in response to the (N−1)-th carry signal CR(N−1).

The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 320.

For example, the control electrode of the fourth transistor T4 may be a gate electrode. The input electrode of the fourth transistor T4 may be a source electrode. The output electrode of the fourth transistor T4 may be a drain electrode. The fourth transistor T4 may be a field relaxation transistor ("FRT") including a floating metal disposed between the drain electrode and the source electrode.

The pull-up part 320 outputs the first clock signal CK as the N-th gate output signal GOUT(N) in response to a signal applied to the first node Q1. The pull-up part 320 includes a first transistor T1. The first transistor T1 includes a control electrode connected to the first node Q1, an input electrode connected to the clock terminal and an output electrode connected to the gate output terminal.

For example, the control electrode of the first transistor T1 may be a gate electrode. The input electrode of the first transistor T1 may be a source electrode. The output electrode of the first transistor T1 may be a drain electrode.

The first voltage adjusting part 330 outputs the first low clock signal CKL to the second node Q2 in response to the signal applied to the first node Q1. The first voltage adjusting part 330 includes transistor T1-1 and a first capacitor C1. The transistor T1-1 includes a control electrode connected to the first node Q1, an input electrode connected to the low clock terminal and an output electrode connected to the second node Q2. The first capacitor includes a first terminal connected to the first node Q1 and a second terminal connected to the second node Q2.

For example, the control electrode of the transistor T1-1 may be a gate electrode. The input electrode of the transistor T1-1 may be a source electrode. The output electrode of the transistor T1-1 may be a drain electrode.

When the transistor T1-1 turned on in response to the signal at the first node Q1, the first low clock signal CKL is applied to the second node Q2. Due to the voltage at the second node Q2, a bootstrap voltage at the first node Q1 decreases. Thus, the voltage at the first node Q2 may be adjusted by the first voltage adjusting part 330.

The voltage at the first node Q1 decreases so that average voltages between the gate electrodes and the source electrodes of the transistors connected to the first node Q1 may decrease. Thus, a positive shift and a negative shift of the threshold voltages of the transistors connected to the first node Q1 may be prevented.

The carry part 340 outputs the first clock signal CK as the N-th carry signal CR(N) in response to the signal applied to the first node Q1. The carry part 340 includes a fifteenth transistor T15. The fifteenth transistor T15 includes a control electrode connected to the first node Q1, an input electrode connected to the clock terminal, and an output electrode connected to the N-th carry terminal.

For example, the control electrode of the fifteenth transistor T15 may be a gate electrode. The input electrode of the fifteenth transistor T15 may be a source electrode. The output electrode of the fifteenth transistor T15 may be a drain electrode.

The inverting part 350 includes a twelfth transistor T12, a seventh transistor T7, a thirteenth transistor T13, and an eighth transistor T8. The twelfth transistor T12 includes a control electrode and an input electrode commonly connected to the clock terminal, and an output electrode connected to a fourth node Q4. The seventh transistor T7 includes a control electrode connected to the fourth node Q4, an input electrode connected to the clock terminal, and an output electrode connected to a third node Q3. The thirteenth transistor T13 includes a control electrode connected to the N-th carry terminal, an input electrode connected to the fourth node Q4 and an output electrode connected to the second "off" terminal. The eighth transistor T8 includes a control electrode connected to the N-th carry terminal, an input electrode connected to the third node Q3, and an output electrode connected to the second "off" terminal.

For example, the control electrodes of the twelfth, seventh, thirteenth, and eighth transistors T12, T7, T13, and T8 may be gate electrodes. The input electrode of the twelfth, seventh, thirteenth, and eighth transistors T12, T7, T13 and T8 may be source electrodes. The output electrode of the twelfth, seventh, thirteenth, and eighth transistors T12, T7, T13 and T8 may be drain electrodes. For example, the twelfth transistor T12 may be a field relaxation transistor ("FRT"), including a floating metal disposed between the drain electrode and the source electrode.

The twelfth transistor T12 is a first inverting transistor. The seventh transistor T7 is a second inverting transistor. The thirteenth transistor T13 is a third inverting transistor. The eighth transistor T8 is a fourth inverting transistor.

The first pull-down part 361 pulls down the voltage at the first node Q1 to the second "off" voltage VSS2 in response to the (N+1)-th carry signal CR(N+1).

The first pull-down part 361 may include switching elements connected to each other in series. For example, the first pull-down part 361 may include two transistors connected to each other in series.

For example, the first pull-down part 361 includes a ninth transistor T9 and transistor T9-1. The ninth transistor T9 includes a control electrode connected to (N+1)-th carry terminal, an input electrode connected to the first node Q1, and an output electrode connected to an input electrode of the transistor T9-1. The transistor T9-1 includes a control electrode connected to the (N+1)-th carry terminal, an input electrode connected to the output electrode of the ninth transistor T9, and an output electrode connected to the second "off" terminal.

For example, the control electrodes of the ninth transistor T9 and the transistor T9-1 may be gate electrodes. The input electrodes of the ninth transistor T9 and the transistor T9-1 may be source electrodes. The output electrodes of the ninth transistor T9 and the transistor T9-1 may be drain electrodes.

The ninth transistor T9 is a first pull-down transistor. The transistor T9-1 is a second pull-down transistor.

The first pull-down part 361 includes the transistors connected to each other in series so that the voltage at the first node Q1 and the second "off" voltage VSS2 may be divided by the ninth transistor T9 and the transistor T9-1. Thus, the reliability of the gate driver 300 is improved, resulting in a longer lifetime for the gate driver 300.

In the present exemplary embodiment, the second node Q2 extends from the second terminal of the first capacitor C1 to the output electrode of the ninth transistor T9.

The voltage at the output electrode of the ninth transistor T9 and the input electrode of the transistor T9-1 is maintained in a uniform level using the voltage at the second node Q2 so that the current of the first node Q1 may be prevented from leaking.

The voltage between the drain electrode and the source electrode of the ninth transistor T9 is greater than the voltage between the drain electrode and the source electrode of the transistor T9-1 so that stress is concentrated in the ninth transistor T9, and characteristics of the ninth transistor T9 are deteriorated conventionally. However, in the present exemplary embodiment, the voltage at the output electrode of the ninth transistor T9 and the input electrode of the transistor T9-1 is maintained at a uniform level using the voltage at the second node Q2 so that the stress is distributed equally into the ninth transistor T9 and the transistor T9-1. Accordingly, the reliability of the gate driver 300 may be improved.

The second pull-down part 362 pulls down the N-th gate output signal GOUT(N) to the first "off" voltage VSS1 in response to the (N+1)-th carry signal CR(N+1). The second pull-down part 362 includes the second transistor T2. The second transistor T2 includes a control electrode connected to the (N+1)-th carry terminal, an input electrode connected to the gate output terminal, and an output electrode connected to the first "off" terminal.

For example, the control electrode of the second transistor T2 may be a gate electrode. The input electrode of the second transistor T2 may be a source electrode. The output electrode of the second transistor T2 may be a drain electrode.

The carry stabilizing part 370 includes a seventeenth transistor T17. The seventeenth transistor T17 includes a control electrode connected to the (N+1)-th carry terminal, an input electrode connected to the N-th carry terminal, and an output electrode connected to the second "off" terminal.

For example, the control electrode of the seventeenth transistor T17 may be a gate electrode. The input electrode of the seventeenth transistor T17 may be a source electrode. The output electrode of the seventeenth transistor T17 may be a drain electrode.

The carry stabilizing part 370 reduces noise resulting from a leakage current transmitted through a fourth transistor T4 of the (N+1)-th stage.

The first holding part 381 may include a plurality of switching elements connected to each other in series. For example, the first holding part 381 may include two transistors connected to each other in series.

For example, the first holding part 381 includes tenth transistor T10 and transistor T10-1. The tenth transistor T10 includes a control electrode connected to the third node Q3, an input electrode connected to the first node Q1 and an output node connected to an input node of the transistor T10-1. The transistor T10-1 includes a control electrode connected to the third node Q3, an input electrode connected to the output electrode of the tenth transistor T10, and an output electrode connected to the second "off" terminal.

For example, the control electrodes of the tenth transistor T10 and the transistor T10-1 may be gate electrodes. The input electrode of the tenth transistor T10 and the transistor T10-1 may be source electrodes. The output electrode of the tenth transistor T10 and the transistor T10-1 may be drain electrodes.

Herein, the tenth transistor T10 is a first holding transistor and the transistor T10-1 is a second holding transistor.

The second holding part 382 includes a third transistor T3. The third transistor T3 includes a control electrode connected to the third node Q3, an input electrode connected to the gate output terminal, and an output electrode connected to the first "off" terminal.

For example, the control electrode of the third transistor T3 may be a gate electrode. The input electrode of the third transistor T3 may be a source electrode. The output electrode of the third transistor T3 may be a drain electrode.

The third holding part 383 includes an eleventh transistor T11. The eleventh transistor T11 includes a control electrode connected to the third node Q3, an input electrode connected to the N-th carry terminal, and an output electrode connected to the second "off" terminal.

For example, the control electrode of the eleventh transistor T11 may be a gate electrode. The input electrode of the eleventh transistor T11 may be a source electrode. The output electrode of the eleventh transistor T11 may be a drain electrode.

In the present exemplary embodiment, although the (N−1)-th carry signal is used as a previous carry signal, the previous carry signal is not limited to the (N−1)-th carry signal. The previous carry signal may be a carry signal of one of previous stages. In addition, although the (N+1)-th carry signal is used as a next carry signal, the next carry signal is not limited to the (N+1)-th carry signal. The next carry signal may be a carry signal of one of next stages.

In the present exemplary embodiment, the first, 1-1, second, third, fourth, seventh, eighth, ninth, 9-1, tenth, 10-1, eleventh, twelfth, thirteenth, fifteenth, and seventeenth transistors may be oxide semiconductor transistors, in which the semiconductor layer may include an oxide semiconductor. For example, the semiconductor layer may include at least one of a zinc oxide, a tin oxide, a gallium indium zinc (Ga—In—Zn) oxide, an indium zinc (In—Zn) oxide, a indium tin (In—Sn) oxide, indium tin zinc (In—Sn—Zn) oxide, etc. The semiconductor layer 130 may include an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, or tungsten (W). The present invention is not limited to a material of the oxide semiconductor.

Alternatively, the first, 1-1, second, third, fourth, seventh, eighth, ninth, 9-1, tenth, 10-1, eleventh, twelfth, thirteenth, fifteenth, and seventeenth transistors may be amorphous silicon transistors.

Referring to FIG. 3, the first clock signal CK has a high level corresponding to the (N−2)-th stage, the N-th stage, the (N+2)-th stage, and the (N+4)-th stage. The second clock signal CKB has a high level corresponding to the (N−1)-th stage, the (N+1)-th stage, and the (N+3)-th stage.

The first low clock signal CKL has a high level corresponding to the (N−2)-th stage, the N-th stage, the (N+2)-th stage, and the (N+4)-th stage. The second low clock signal CKBL has a high level corresponding to the (N−1)-th stage, the (N+1)-th stage, and the (N+3)-th stage.

The (N−1)-th carry signal CR(N−1) has a high level corresponding to the (N−1)-th stage. The (N+1)-th carry signal CR(N+1) has a high level corresponding to the (N+1)-th stage.

The gate output signal GOUT(N) of the N-th stage is synchronized with the first clock signal CK, and has a high level corresponding to the N-th stage. The N-th carry signal CR(N) is synchronized with the first clock signal CK, and has a high level corresponding to the N-th stage.

A voltage of the first node Q1 of the N-th stage is increased to a first level corresponding to the (N−1)-th stage by the pull-up control part 310. The voltage at the first node Q1 of the N-th stage is increased to a second level, which is higher than the first level, corresponding to the N-th stage, by the pull-up part 320 and the first voltage adjusting part 330. The voltage at the first node Q1 of the N-th stage is decreased corresponding to the (N+1)-th stage by the first pull-down part 361.

A voltage at the second node Q2 of the N-th stage has a high level corresponding to the N-th stage by the first voltage adjusting part 330 and is decreased corresponding to the (N+1)-th stage by the first pull-down part 361.

A voltage at the third node Q3 of the N-th stage is synchronized with the first clock signal CK. The voltage of the third node Q3 of the N-th stage has a high level corresponding to the (N−2)-th stage, the (N+2)-th stage, and the (N+4)-th stage by the inverting part 350. The voltage of the third node Q3 of the N-th stage has a high level except for the N-th stage at which the gate output signal GOUT has a high level. The voltage of the third node Q3 may be an inverting output signal.

According to the present exemplary embodiment, the voltage at the first node Q1 is prevented from being excessively increased by the first voltage adjusting part 330 so that deterioration of various characteristics, such as a decrease of mobility, of the transistors connected to the first node Q1, may be prevented. In addition, a positive shift and a negative shift of the threshold voltages of the transistors connected to the first node Q1 may be prevented. Therefore, the reliability of the gate driving circuit may be improved.

Figure 4:
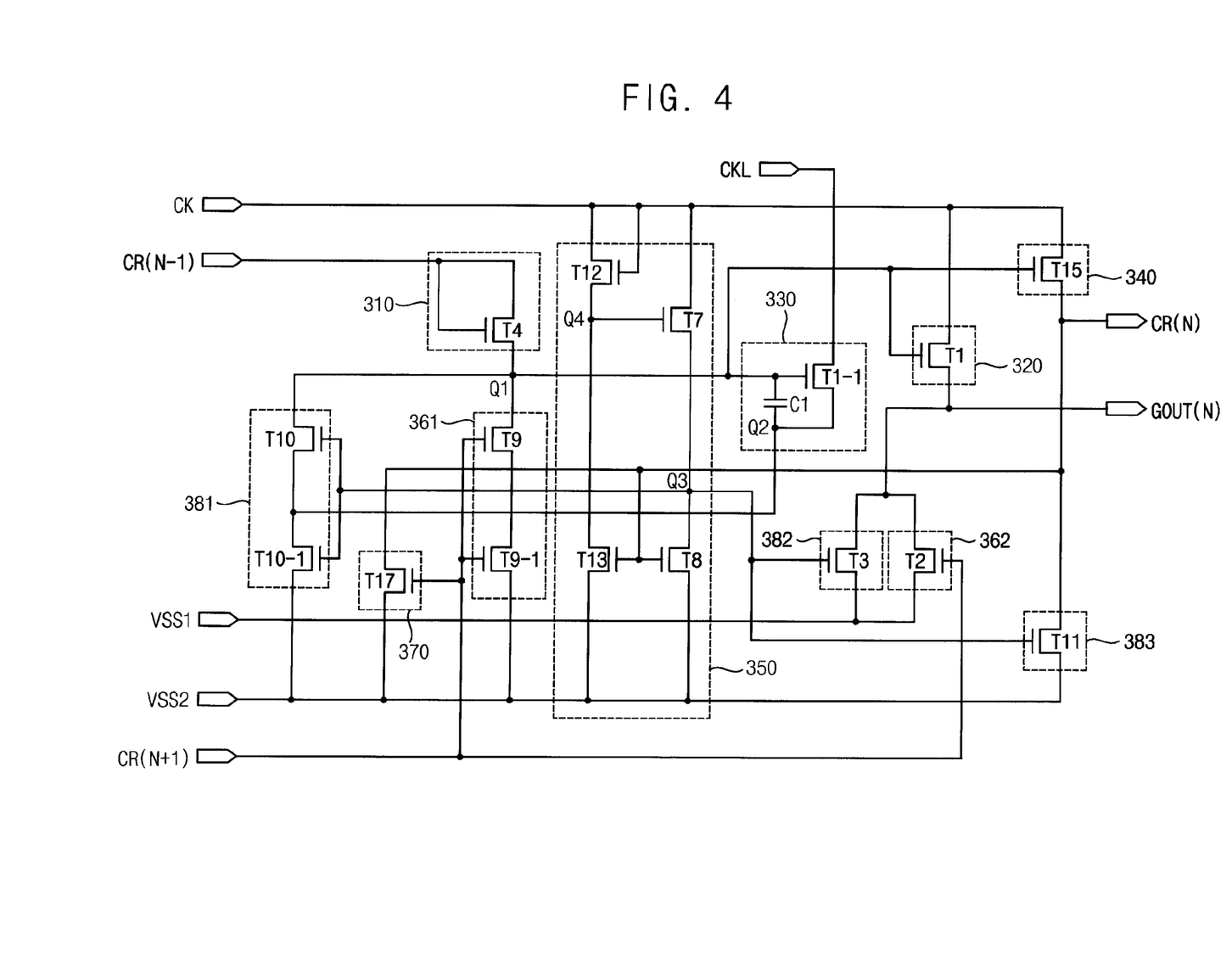
FIG. 4 is an equivalent circuit diagram illustrating an N-th stage of a gate driver according to an exemplary embodiment of the present invention.

FIG. 4 is an equivalent circuit diagram illustrating an N-th stage of a gate driver according to an exemplary embodiment of the present invention.

The display apparatus according to the present exemplary embodiment is substantially the same as the display apparatus of the exemplary embodiment described in FIGS. 1 to 3, except that the second node Q2 is connected to a node between the first holding transistor T10 and the second holding transistor T10-1. Thus, the same reference numerals will be used to refer to the same or like parts as those described in the previous exemplary embodiment of FIGS. 1 to 3, and any repetitive explanation concerning the above elements will be omitted.

Referring to FIGS. 1 to 4, the N-th stage outputs an N-th gate output signal GOUT(N) and an N-th carry signal CR(N) in response to an (N−1)-th carry signal CR(N−1) of an (N−1)-th stage, which is a previous stage of the N-th stage. The N-th stage pulls down the N-th gate output signal GOUT(N) to the first "off" voltage VSS1 in response to an (N+1)-th carry signal CR(N+1) of an (N+1)-th stage, which is a next stage of the N-th stage.

The n-th stage includes a pull-up control part 310, a pull-up part 320, a first voltage adjusting part 330, a carry part 340, an inverting part 350, a first pull-down part 361, a second pull-down part 362, a carry stabilizing part 370, a first holding part 381, a second holding part 382, and a third holding part 383.

The pull-up control part 310 applies the (N−1)-th carry signal CR(N−1) to a first node Q1 in response to the (N−1)-th carry signal CR(N−1).

The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 320.

The pull-up part 320 outputs the first clock signal CK as the N-th gate output signal GOUT(N) in response to a signal applied to the first node Q1.

The pull-up part 320 includes a first transistor T1. The first transistor T1 includes a control electrode connected to the first node Q1, an input electrode connected to the clock terminal, and an output electrode connected to the gate output terminal.

The first voltage adjusting part 330 outputs the first low clock signal CKL to the second node Q2 in response to the signal applied to the first node Q1. The first voltage adjusting part 330 includes transistor T1-1 and a first capacitor C1. The transistor T1-1 includes a control electrode connected to the first node Q1, an input electrode connected to the low clock terminal, and an output electrode connected to the second node Q2. The first capacitor includes a first terminal connected to the first node Q1 and a second terminal connected to the second node Q2.

The first holding part 381 may include switching elements connected to each other in series. For example, the first holding part 381 may include two transistors, tenth transistor T10 and transistor T10-1, connected to each other in series. The tenth transistor T10 includes a control electrode connected to the third node Q3, an input electrode connected to the first node Q1, and an output node connected to an input node of the transistor T10-1. The transistor T10-1 includes a control electrode connected to the third node Q3, an input electrode connected to the output electrode of the tenth transistor T10, and an output electrode connected to the second off terminal.

The control electrodes of the tenth transistor T10 and the transistor T10-1 may be gate electrodes. The input electrode of the tenth transistor T10 and the transistor T10-1 may be source electrodes. The output electrode of the tenth transistor T10 and the transistor T10-1 may be drain electrodes.

The tenth transistor T10 is a first holding transistor and the transistor T10-1 is a second holding transistor.

The first holding part 381 includes the transistors T10 and transistor T10-1 connected to each other in series so that the voltage at the first node Q1 and the second "off" voltage VSS2 may be divided between the tenth transistor T10 and the transistor T10-1. Thus, the reliability of the gate driver 300 is improved and a lifetime of the gate driver 300 may be increased.

In the exemplary embodiment of FIG. 4, the second node Q2 extends from the second terminal of the first capacitor C1 to the output electrode of the tenth transistor T10.

The voltage between the drain electrode and the source electrode of the tenth transistor T10 is greater than the voltage between the drain electrode and the source electrode of the transistor T10-1. Therefore, stress is concentrated on the tenth transistor T10 and characteristics of the tenth transistor T10 are deteriorated conventionally. However, in the present exemplary embodiment, the voltage at the output electrode of the tenth transistor T10 and the input electrode of the transistor T10-1 is maintained at a uniform level using the voltage at the second node Q2 such that the stress is distributed to the tenth transistor T10 and the transistor T10-1. Accordingly, the reliability of the gate driver 300 may be improved.

In the exemplary embodiment of FIG. 4, although the (N−1)-th carry signal is used as a previous carry signal, the previous carry signal is not limited to the (N−1)-th carry signal. The previous carry signal may be a carry signal of one of previous stages. In addition, although the (N+1)-th carry signal is used as a next carry signal, the next carry signal is not limited to the (N+1)-th carry signal. The next carry signal may be a carry signal of one of next stages.

In the exemplary embodiment of FIG. 4, the first, 1-1, second, third, fourth, seventh, eighth, ninth, 9-1, tenth, 10-1, eleventh, twelfth, thirteenth, fifteenth, and seventeenth transistors may be oxide semiconductor transistors. Alternatively, the first, 1-1, second, third, fourth, seventh, eighth, ninth, 9-1, tenth, 10-1, eleventh, twelfth, thirteenth, fifteenth, and seventeenth transistors may be amorphous silicon transistors.

According to the exemplary embodiment of FIG. 4, the voltage at the first node Q1 is prevented from being excessively increased by the first voltage adjusting part 330 so that deterioration of various characteristics, such as decrease of mobility, of the transistors connected to the first node Q1, may be prevented. In addition, a positive shift and a negative shift of the threshold voltages of the transistors connected to the first node Q1 may be prevented. Therefore, the reliability of the gate driving circuit may be improved.

Figure 5:
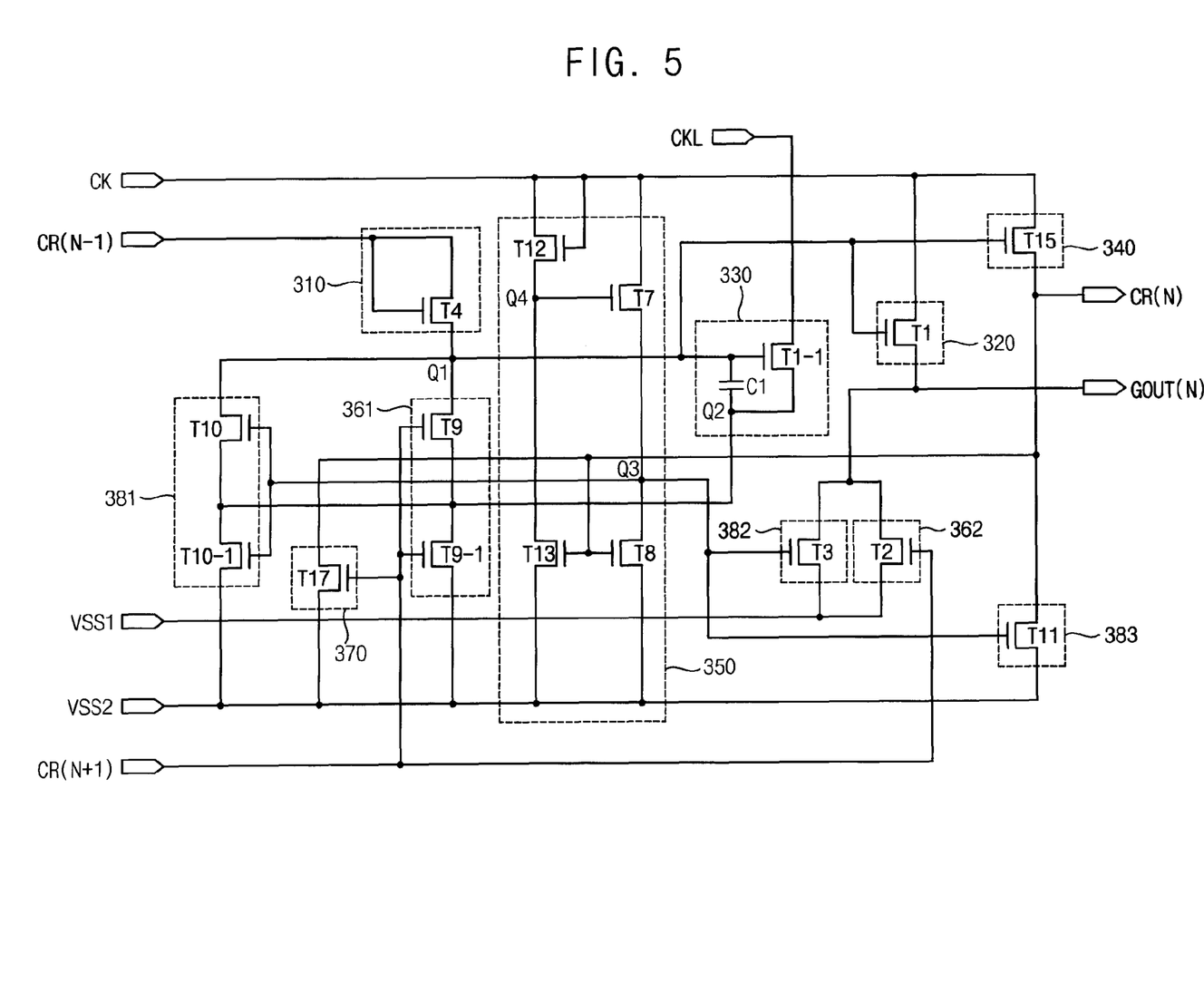
FIG. 5 is an equivalent circuit diagram illustrating an N-th stage of a gate driver according to an exemplary embodiment of the present invention.

FIG. 5 is an equivalent circuit diagram illustrating an N-th stage of a gate driver according to an exemplary embodiment of the present invention.

The display apparatus according to FIG. 5 is substantially the same as the display apparatus of the previous exemplary embodiment explained referring to FIGS. 1 to 3, except that the second node Q2 is connected to both a node between the first pull-down transistor T9 and the second pull-down transistor T9-1 and a node between the first holding transistor T10 and the second holding transistor T10-1. Thus, the same reference numerals will be used to refer to the same or like parts as those described in the previous exemplary embodiment of FIGS. 1 to 3, and any repetitive explanation concerning the above elements will be omitted.

Referring to FIGS. 1 to 3 and 5, the N-th stage outputs an N-th gate output signal GOUT(N) and an N-th carry signal CR(N) in response to an (N−1)-th carry signal CR(N−1) of an (N−1)-th stage, which is a previous stage of the N-th stage. The N-th stage pulls down the N-th gate output signal GOUT(N) to the first "off" voltage VSS1 in response to an (N+1)-th carry signal CR(N+1) of an (N+1)-th stage, which is a next stage of the N-th stage.

The n-th stage includes a pull-up control part 310, a pull-up part 320, a first voltage adjusting part 330, a carry part 340, an inverting part 350, a first pull-down part 361, a second pull-down part 362, a carry stabilizing part 370, a first holding part 381, a second holding part 382 and a third holding part 383.

The pull-up control part 310 applies the (N−1)-th carry signal CR(N−1) to a first node Q1 in response to the (N−1)-th carry signal CR(N−1). The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 320.

The pull-up part 320 outputs the first clock signal CK as the N-th gate output signal GOUT(N) in response to a signal applied to the first node Q1. The pull-up part 320 includes a first transistor T1. The first transistor T1 includes a control electrode connected to the first node Q1, an input electrode connected to the clock terminal and an output electrode connected to the gate output terminal.

The first voltage adjusting part 330 outputs the first low clock signal CKL to the second node Q2 in response to the signal applied to the first node Q1. The first voltage adjusting part 330 includes transistor T1-1 and a first capacitor C1. The transistor T1-1 includes a control electrode connected to the first node Q1, an input electrode connected to the low clock terminal, and an output electrode connected to the second node Q2. The first capacitor includes a first terminal connected to the first node Q1 and a second terminal connected to the second node Q2.

The first pull-down part 361 may include switching elements connected to each other in series. For example, the first pull-down part 361 may include two transistors, ninth transistor T9 and transistor T9-1, connected to each other in series. The ninth transistor T9 includes a control electrode connected to (N+1)-th carry terminal, an input electrode connected to the first node Q1, and an output electrode connected to an input electrode of the transistor T9-1. The transistor T9-1 includes a control electrode connected to the (N+1)-th carry terminal, an input electrode connected to the output electrode of the ninth transistor T9, and an output electrode connected to the second off terminal.

For example, the control electrodes of the ninth transistor T9 and the transistor T9-1 may be gate electrodes. The input electrode of the ninth transistor T9 and the transistor T9-1 may be source electrodes. The output electrode of the ninth transistor T9 and the transistor T9-1 may be drain electrodes.

The ninth transistor T9 is a first pull-down transistor. The transistor T9-1 is a second pull-down transistor.

The first pull-down part 361 includes the transistors connected to each other in series so that the voltage at the first node Q1 and the second "off" voltage VSS2 may be divided between the ninth transistor T9 and the transistor T9-1. Thus, the reliability of the gate driver 300 is improved and a lifetime of the gate driver 300 may be increased.

The first holding part 381 may include switching elements connected to each other in series. For example, the first holding part 381 may include two transistors, tenth transistor T10 and transistor T10-1, connected to each other in series. The tenth transistor T10 includes a control electrode connected to the third node Q3, an input electrode connected to the first node Q1, and an output node connected to an input node of the transistor T10-1. The transistor T10-1 includes a control electrode connected to the third node Q3, an input electrode connected to the output electrode of the tenth transistor T10, and an output electrode connected to the second off terminal.

For example, the control electrodes of the tenth transistor T10 and the transistor T10-1 may be gate electrodes. The input electrode of the tenth transistor T10 and the transistor T10-1 may be source electrodes. The output electrode of the tenth transistor T10 and the transistor T10-1 may be drain electrodes.

The tenth transistor T10 is a first holding transistor and the transistor T10-1 is a second holding transistor.

The first holding part 381 includes the transistors connected to each other in series so that the voltage at the first node Q1 and the second "off" voltage VSS2 may be divided between the tenth transistor T10 and the transistor T10-1. Thus, the reliability of the gate driver 300 is improved and a lifetime of the gate driver 300 may increase.

In the exemplary embodiment of FIG. 5, the second node Q2 extends from the second terminal of the first capacitor C1 to the output electrode of the ninth transistor T9 and the output electrode of the tenth transistor T10.

The voltage between the drain electrode and the source electrode of the ninth transistor T9 is greater than the voltage between the drain electrode and the source electrode of the transistor T9-1, and the voltage between the drain electrode and the source electrode of the tenth transistor T10 is greater than the voltage between the drain electrode and the source electrode of the transistor T10-1. Therefore, stress is concentrated in the ninth and tenth transistors T9 and T10 and characteristics of the ninth and tenth transistors T9 and T10 are deteriorated conventionally. However, in the exemplary embodiment of FIG. 5, the voltage at the output electrodes of the ninth and tenth transistors T9 and T10 and the input electrodes of the transistors T9-1 and T10-1 is maintained at a uniform level using the voltage at the second node Q2 such that the stress is distributed to the ninth transistor T9 and the transistor T9-1 and is distributed to the tenth transistor T10 and the transistor T10-1. Accordingly, the reliability of the gate driver 300 may be improved.

In the exemplary embodiment of FIG. 5, although the (N−1)-th carry signal is used as a previous carry signal, the previous carry signal is not limited to the (N−1)-th carry signal. The previous carry signal may be a carry signal of one of previous stages. In addition, although the (N+1)-th carry signal is used as a next carry signal, the next carry signal is not limited to the (N+1)-th carry signal. The next carry signal may be a carry signal of one of next stages.

In the exemplary embodiment of FIG. 5, the first, 1-1, second, third, fourth, seventh, eighth, ninth, 9-1, tenth, 10-1, eleventh, twelfth, thirteenth, fifteenth, and seventeenth transistors may be oxide semiconductor transistors. Alternatively, the first, 1-1, second, third, fourth, seventh, eighth, ninth, 9-1, tenth, 10-1, eleventh, twelfth, thirteenth, fifteenth, and seventeenth transistors may be amorphous silicon transistors.

According to the exemplary embodiment of FIG. 5, the voltage at the first node Q1 is prevented from being excessively increased by the first voltage adjusting part 330 so that the deterioration of the characteristics, such as decrease of mobility, of the transistors connected to the first node Q1 may be prevented. In addition, a positive shift and a negative shift of the threshold voltages of the transistors connected to the first node Q1 may be prevented. Therefore, the reliability of the gate driving circuit may be improved.

Figure 6:
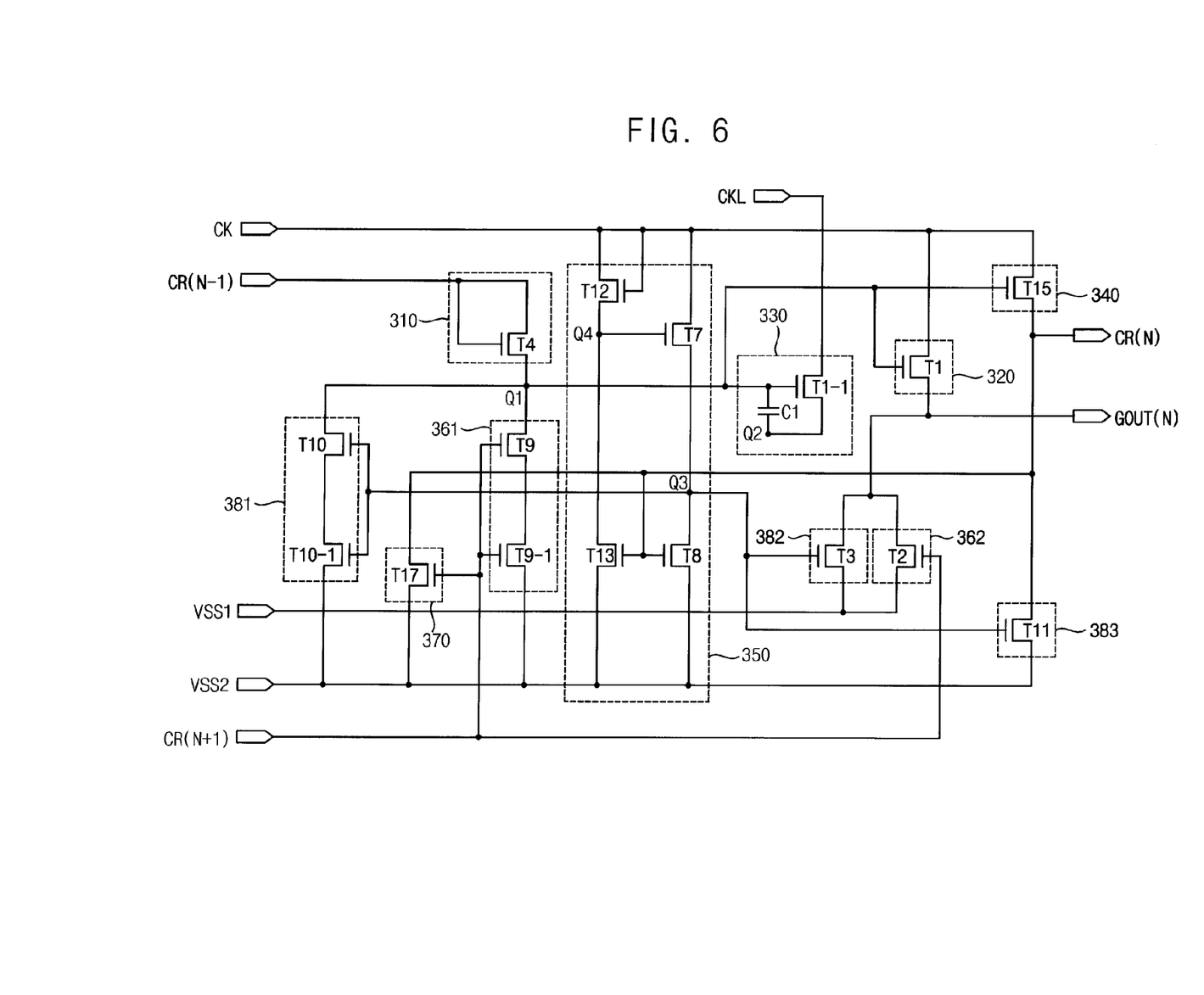
FIG. 6 is an equivalent circuit diagram illustrating an N-th stage of a gate driver according to an exemplary embodiment of the present invention.

FIG. 6 is an equivalent circuit diagram illustrating an N-th stage of a gate driver according to an exemplary embodiment of the present invention.

The display apparatus according to the exemplary embodiment of FIG. 6 is substantially the same as the display apparatus of the previous exemplary embodiment explained referring to FIGS. 1 to 3, except that the second node Q2 does not extend from the second terminal of the first capacitor C1 to any other elements except transistor T1-1. Thus, the same reference numerals will be used to refer to the same or like parts as those described in the previous exemplary embodiment of FIGS. 1 to 3, and any repetitive explanation concerning the above elements will be omitted.

Referring to FIGS. 1 to 3 and 6, the N-th stage outputs an N-th gate output signal GOUT(N) and an N-th carry signal CR(N) in response to an (N−1)-th carry signal CR(N−1) of an (N−1)-th stage, which is a previous stage of the N-th stage. The N-th stage pulls down the N-th gate output signal GOUT(N) to the first "off" voltage VSS1 in response to an (N+1)-th carry signal CR(N+1) of an (N+1)-th stage, which is a next stage of the N-th stage.

The n-th stage includes a pull-up control part 310, a pull-up part 320, a first voltage adjusting part 330, a carry part 340, an inverting part 350, a first pull-down part 361, a second pull-down part 362, a carry stabilizing part 370, a first holding part 381, a second holding part 382, and a third holding part 383. The pull-up control part 310 applies the (N−1)-th carry signal CR(N−1) to a first node Q1 in response to the (N−1)-th carry signal CR(N−1).

The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 320. The pull-up part 320 outputs the first clock signal CK as the N-th gate output signal GOUT(N) in response to a signal applied to the first node Q1.

The pull-up part 320 includes a first transistor T1. The first transistor T1 includes a control electrode connected to the first node Q1, an input electrode connected to the clock terminal, and an output electrode connected to the gate output terminal. The first voltage adjusting part 330 outputs the first low clock signal CKL to the second node Q2 in response to the signal applied to the first node Q1.

The first voltage adjusting part 330 outputs the first low clock signal CKL to the second node Q2 in response to the signal applied to the first node Q1. The first voltage adjusting part 330 includes transistor T1-1 and a first capacitor C1. The transistor T1-1 includes a control electrode connected to the first node Q1, an input electrode connected to the low clock terminal, and an output electrode connected to the second node Q2. The first capacitor includes a first terminal connected to the first node Q1 and a second terminal connected to the second node Q2.

transistor T1-1 The first pull-down part 361 may include switching elements connected to each other in series. For example, the first pull-down part 361 may include two transistors, ninth transistor T9 and transistor T9-1, connected to each other in series. The ninth transistor T9 includes a control electrode connected to (N+1)-th carry terminal, an input electrode connected to the first node Q1, and an output electrode connected to an input electrode of the transistor T9-1. The transistor T9-1 includes a control electrode connected to the (N+1)-th carry terminal, an input electrode connected to the output electrode of the ninth transistor T9, and an output electrode connected to the second "off" terminal.

The first holding part 381 may include switching elements connected to each other in series. For example, the first holding part 381 may include two transistors, tenth transistor T10 and transistor T10-1, connected to each other in series. The tenth transistor T10 includes a control electrode connected to the third node Q3, an input electrode connected to the first node Q1, and an output node connected to an input node of the transistor T10-1. The transistor T10-1 includes a control electrode connected to the third node Q3, an input electrode connected to the output electrode of the tenth transistor T10, and an output electrode connected to the second "off" terminal.

In the exemplary embodiment of FIG. 6, the second node Q2 does not extend from the second terminal of the first capacitor C1 of the first voltage adjusting part 330 to any other element except transistor T1-1.

A level of the bootstrap voltage at the first node Q1 is decreased by the first voltage adjusting part 330. Thus, an excessive VDS may be not applied to the transistors of the first pull-down part 361 and the first holding part 381. Therefore, the transistors of the first pull-down part 361 and the first holding part 381 may be protected.

According to the exemplary embodiment of FIG. 6, the voltage at the first node Q1 is prevented from being excessively increased by the first voltage adjusting part 330 so that the deterioration of various characteristics, such as a decrease of mobility, of the transistors connected to the first node Q1, may be prevented. Therefore, the reliability of the gate driving circuit may be improved FIG. 7 is an equivalent circuit diagram illustrating an N-th stage of a gate driver according to an exemplary embodiment of the present invention.

Figure 7:
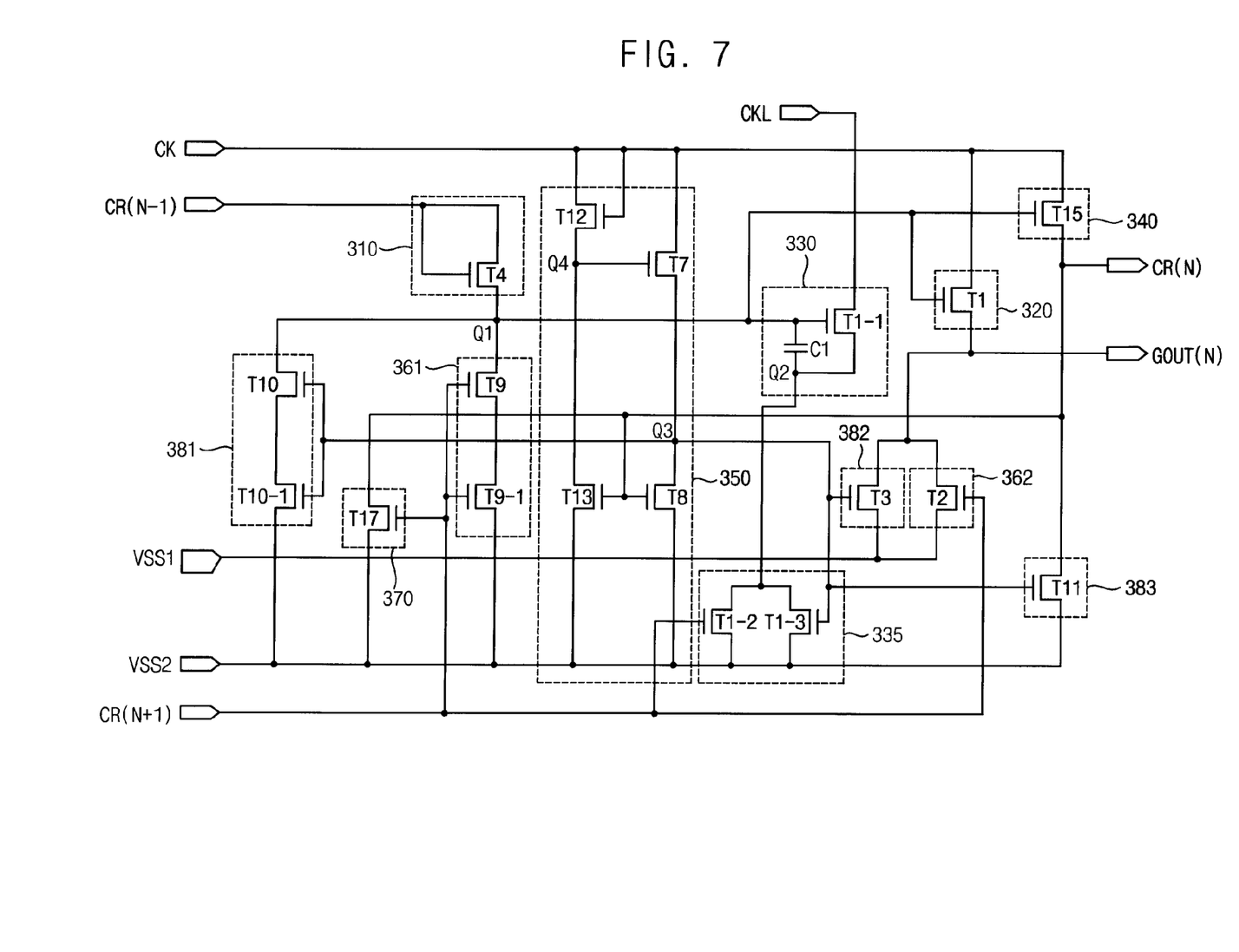
FIG. 7 is an equivalent circuit diagram illustrating an N-th stage of a gate driver according to an exemplary embodiment of the present invention.

The display apparatus according to the exemplary embodiment of FIG. 7 is substantially the same as the display apparatus of the previous exemplary embodiment explained referring to FIGS. 1 to 3, except that the display apparatus further includes a second voltage adjusting part 335 connected to the second node Q2. Thus, the same reference numerals will be used to refer to the same or like parts as those described in the previous exemplary embodiment of FIGS. 1 to 3, and any repetitive explanation concerning the above elements will be omitted.

Referring to FIGS. 1 to 3 and 7, the N-th stage outputs an N-th gate output signal GOUT(N) and an N-th carry signal CR(N) in response to an (N−1)-th carry signal CR(N−1) of an (N−1)-th stage, which is a previous stage of the N-th stage. The N-th stage pulls down the N-th gate output signal GOUT (N) to the first "off" voltage VSS1 in response to an (N+1)-th carry signal CR(N+1) of an (N+1)-th stage, which is a next stage of the N-th stage.

The n-th stage includes a pull-up control part 310, a pull-up part 320, a first voltage adjusting part 330, the second voltage adjusting part 335, a carry part 340, an inverting part 350, a first pull-down part 361, a second pull-down part 362, a carry stabilizing part 370, a first holding part 381, a second holding part 382 and a third holding part 383.

The pull-up control part 310 applies the (N−1)-th carry signal CR(N−1) to a first node Q1 in response to the (N−1)-th carry signal CR(N−1). The pull-up control part 310 includes a fourth transistor T4. The fourth transistor T4 includes a control electrode and an input electrode commonly connected to the (N−1)-th carry terminal, and an output electrode connected to a first node Q1. The first node Q1 is connected to a control electrode of the pull-up part 320.

The pull-up part 320 outputs the first clock signal CK as the N-th gate output signal GOUT(N) in response to a signal applied to the first node Q1. The pull-up part 320 includes a first transistor T1. The first transistor T1 includes a control electrode connected to the first node Q1, an input electrode connected to the clock terminal, and an output electrode connected to the gate output terminal.

The first voltage adjusting part 330 outputs the first low clock signal CKL to the second node Q2 in response to the signal applied to the first node Q1. The first voltage adjusting part 330 includes transistor T1-1 and a first capacitor C1. The transistor T1-1 includes a control electrode connected to the first node Q1, an input electrode connected to the low clock terminal, and an output electrode connected to the second node Q2. The first capacitor includes a first terminal connected to the first node Q1 and a second terminal connected to the second node Q2.

transistor T1-1 The second voltage adjusting part 335 outputs the second "off" voltage VSS2 to the second node Q2 in response to the (N+1)-th carry signal CR(N+1) and the signal applied at the third node Q3. The second voltage adjusting part 335 includes transistor T1-2 and transistor T1-3. The transistor T1-2 includes a control electrode connected to the (N+1)-th carry terminal, an input electrode connected to the second node Q2, and an output electrode connected to the second "off" terminal. The transistor T1-3 includes a control electrode connected to the third node Q3, an input electrode connected to the second node Q2, and an output electrode connected to the second "off" terminal.

The second voltage adjusting part 335 sets the voltage at the second node Q2 to the second "off" voltage corresponding to a stage after (N+1)-th stage. Thus, the voltage at the second node Q2 may be stabilized, and a reliability of the operation of the first voltage adjusting part 330 may be improved.

The transistor T1-1 may be a first voltage adjusting transistor, the transistor T1-2 may be a second voltage adjusting transistor and the transistor T1-3 may be a third voltage adjusting transistor.

The first pull-down part 361 may include a plurality of switching elements connected to each other in series. For example, the first pull-down part 361 may include two transistors, a ninth transistor T9 and transistor T9-1, connected to each other in series. The ninth transistor T9 includes a control electrode connected to (N+1)-th carry terminal, an input electrode connected to the first node Q1 and an output electrode connected to an input electrode of the transistor T9-1. The transistor T9-1 includes a control electrode connected to the (N+1)-th carry terminal, an input electrode connected to the output electrode of the ninth transistor T9, and an output electrode connected to the second "off" terminal.

The first holding part 381 may include elements connected to each other in series. For example, the first holding part 381 may include two transistors, tenth transistor T10 and transistor T10-1, connected to each other in series. The tenth transistor T10 includes a control electrode connected to the third node Q3, an input electrode connected to the first node Q1, and an output node connected to an input node of the transistor T10-1. The transistor T10-1 includes a control electrode connected to the third node Q3, an input electrode connected to the output electrode of the tenth transistor T10, and an output electrode connected to the second "off" terminal.

A level of the bootstrap voltage at the first node Q1 is decreased by the first voltage adjusting part 330. Thus, an excessive VDS may be not applied to the transistors of the first pull-down part 361 and the first holding part 381. Therefore, the transistors of the first pull-down part 361 and the first holding part 381 may be protected.

According to the present exemplary embodiment, the voltage at the first node Q1 is prevented from being excessively increased by the first voltage adjusting part 330 so that the deterioration of various characteristics, such as decrease of mobility, of the transistors connected to the first node Q1, may be prevented. In addition, a positive shift and a negative shift of the threshold voltages of the transistors connected to the first node Q1 may be prevented. Therefore, the reliability of the gate driving circuit may be improved.

According to the gate driving circuit and the display apparatus having the gate driving circuit, the gate driving circuit includes a voltage adjusting part using a low clock signal such that the reliability of the gate driving circuit is increased, thereby extending the lifetime of the gate driving circuit.

The foregoing is illustrative of the present invention and is not to be construed as limiting thereof. It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. In the claims, means-plus-function clauses are intended to cover the structures described herein as performing the recited function and, not only structural equivalents, but also equivalent structures. Therefore, the present invention is defined by the following claims, with equivalents of the claims to be included therein.

What is claimed is:

1. A gate driving circuit comprising:
   a pull-up control part configured to apply a carry signal of a previous stage to a first node in response to the carry signal of the previous stage;
   a pull-up part configured to output a clock signal as an N-th gate output signal in response to a signal applied to the first node;
   a carry part configured to output the clock signal as an N-th carry signal in response to the signal applied to the first node;
   a first voltage adjusting part configured to output a low clock signal to a second node in response to the signal applied to the first node;
   a first pull-down part configured to pull down the signal at the first node to a second "off" voltage in response to a carry signal of a subsequent stage; and
   a second pull-down part configured to pull down the N-th gate output signal to a first "off" voltage in response to the carry signal of the subsequent stage,
   wherein N is a positive integer.

2. The gate driving circuit of claim 1, wherein an amplitude of the low clock signal is less than an amplitude of the clock signal.

3. The gate driving circuit of claim 2, wherein:
   the clock signal has a high level corresponding to a first "on" voltage, and a low level corresponding to the second "off" voltage; and
   the low clock signal has a high level corresponding to a second "on" voltage that is less than the first "on" voltage, and a low level corresponding to the second "off" voltage.

4. The gate driving circuit of claim 1, wherein:
   the first voltage adjusting part comprises a first voltage adjusting transistor and a first capacitor;
   the first voltage adjusting transistor comprises a control electrode connected to the first node, an input electrode to which the low clock signal is applied, and an output electrode connected to the second node; and
   the first capacitor comprises a first terminal connected to the first node and a second terminal connected to the second node.

5. The gate driving circuit of claim 4, wherein:
   the first pull-down part comprises a first pull-down transistor and a second pull-down transistor connected to each other in series;
   the first pull-down transistor comprises a control electrode to which the carry signal of one of the next stages is applied, an input electrode connected to the first node, and an output electrode connected to an input electrode of the second pull-down transistor; and
   the second pull-down transistor comprises a control electrode to which the carry signal of one of the next stages is applied, an input electrode connected to the output terminal of the first pull-down transistor, and an output electrode to which the second "off" voltage is applied.

6. The gate driving circuit of claim 5, wherein the second node is connected to the output electrode of the first pull-down transistor.

7. The gate driving circuit of claim 4, further comprising a first holding part comprising a first holding transistor and a second holding transistor connected to each other in series, wherein:
   the first holding transistor comprises a control electrode connected to a third node, an input electrode connected to the first node, and an output electrode connected to an input electrode of the second holding transistor, and
   the second holding transistor comprises a control electrode connected to the third node, an input electrode connected to the output electrode of the first holding transistor, and an output electrode to which the second "off" voltage is applied.

8. The gate driving circuit of claim 7, wherein the second node is connected to the output electrode of the first holding transistor.

9. The gate driving circuit of claim 4, further comprising a first holding part comprising a first holding transistor and a second holding transistor connected to each other in series, wherein:
   the first pull-down part comprises a first pull-down transistor and a second pull-down transistor connected to each other in series;
   the first pull-down transistor comprises a control electrode to which the carry signal of one of the next stages is applied, an input electrode connected to the first node, and an output electrode connected to an input electrode of the second pull-down transistor;
   the second pull-down transistor comprises a control electrode to which the carry signal of one of the next stages is applied, an input electrode connected to the output terminal of the first pull-down transistor, and an output electrode to which the second "off" voltage is applied;
   the first holding transistor comprises a control electrode connected to a third node, an input electrode connected to the first node, and an output electrode connected to an input electrode of the second holding transistor; and
   the second holding transistor comprises a control electrode connected to the third node, an input electrode connected to the output electrode of the first holding transistor, and an output electrode to which the second "off" voltage is applied.

10. The gate driving circuit of claim 9, wherein the second node is connected to the output electrode of the first pull-down transistor and the output electrode of the first holding transistor.

11. The gate driving circuit of claim 4, further comprising a second voltage adjusting part configured to output the second "off" voltage to the second node in response to the carry signal of a subsequent stage and a signal applied to the third node.

12. The gate driving circuit of claim 11, wherein the second voltage adjusting part comprises:
    a second voltage adjusting transistor comprising a control electrode to which the carry signal of the subsequent stage is applied, an input electrode connected to the second node, and an output electrode to which the second "off" voltage is applied; and
    a third voltage adjusting transistor comprising a control electrode connected to the third node, an input electrode connected to the second node, and an output electrode to which the second "off" voltage is applied.

13. The gate driving circuit of claim 1, further comprising a carry stabilizing transistor comprising a control electrode to which the carry signal of the subsequent stage is applied, an input electrode connected to a terminal outputting the N-th carry signal, and an output electrode to which the second "off" voltage is applied.

14. The gate driving circuit of claim 1, wherein the gate driving circuit comprises oxide semiconductor transistors.

15. A display apparatus comprising:
    a display panel comprising a display region on which an image is displayed, and a peripheral region adjacent to the display region;

a data driving circuit configured to apply a data voltage to the display panel; and a gate driving circuit configured to apply a gate output signal to the display panel, wherein the gate driving circuit comprises:

a pull-up control part configured to apply a carry signal of a previous stage to a first node in response to the carry signal of one of the previous stages;

a pull-up part configured to output a clock signal as an N-th gate output signal in response to a signal applied to the first node;

a carry part configured to output the clock signal as an N-th carry signal in response to the signal applied to the first node;

a first voltage adjusting part configured to output a low clock signal to a second node in response to the signal applied to the first node;

a first pull-down part configured to pull down the signal at the first node to a second "off" voltage in response to a carry signal of one of next stages; and a second pull-down part configured to pull down the N-th gate output signal to a first "off" voltage in response to the carry signal of the subsequent stage, wherein N is a positive integer.

16. The display apparatus of claim 15, wherein an amplitude of the low clock signal is less than an amplitude of the clock signal.

17. The display apparatus of claim 16, wherein the clock signal has a high level of a first "on" voltage and a low level of the second "off" voltage, and the low clock signal has a high level of a second "on" voltage less than the first "on" voltage and a low level of the second "off" voltage.

18. The display apparatus of claim 15, wherein:

the first voltage adjusting part comprises a first voltage adjusting transistor and a first capacitor;

the first voltage adjusting transistor comprises a control electrode connected to the first node, an input electrode to which the low clock signal is applied, and an output electrode connected to the second node; and the first capacitor comprises a first terminal connected to the first node and a second terminal connected to the second node.

19. The display apparatus of claim 15, wherein the gate driving circuit comprises oxide semiconductor transistors.

20. The display apparatus of claim 15, wherein the gate driving circuit is arranged on the peripheral region of the display panel.

* * * * *